(12) United States Patent
Tomikawa et al.

(10) Patent No.: US 9,576,699 B2
(45) Date of Patent: Feb. 21, 2017

(54) WIRING MEMBER, METHOD OF MANUFACTURING THE SAME, METHOD OF DESIGNING THE SAME, AND ELECTRONIC APPARATUS

(71) Applicant: FUJI XEROX CO., LTD., Tokyo (JP)

(72) Inventors: Ichiro Tomikawa, Ebina (JP); Yasumasa Asaya, Yokohama (JP)

(73) Assignee: FUJI XEROX CO., LTD., Tokyo (JP)

(*) Notice: Subject to any disclaimer, the term of this patent is extended or adjusted under 35 U.S.C. 154(b) by 0 days.

(21) Appl. No.: 14/874,731

(22) Filed: Oct. 5, 2015

(65) Prior Publication Data
US 2016/0134039 A1    May 12, 2016

(30) Foreign Application Priority Data

Nov. 6, 2014 (JP) ................. 2014-226480
Nov. 6, 2014 (JP) ................. 2014-226481

(51) Int. Cl.
*H01R 12/72* (2011.01)
*H01R 12/79* (2011.01)
*H01B 7/08* (2006.01)

(52) U.S. Cl.
CPC .............. *H01B 7/08* (2013.01); *H01R 12/727* (2013.01); *H01R 12/79* (2013.01)

(58) Field of Classification Search
CPC .............................. H01R 12/727; H01R 12/79
See application file for complete search history.

(56) References Cited

U.S. PATENT DOCUMENTS

| | | | |
|---|---|---|---|
| 3,459,879 A | 8/1969 | Gerpheide | |
| 3,582,532 A | 6/1971 | Plummer | |
| 3,612,744 A | 10/1971 | Thomas | |
| 3,700,825 A | 10/1972 | Taplin et al. | |
| 3,757,029 A | 9/1973 | Marshall | |
| 4,287,385 A | 9/1981 | Dombrowsky | |
| 5,008,490 A | 4/1991 | Strauss et al. | |
| 6,969,807 B1 | 11/2005 | Lin et al. | |
| 2011/0036615 A1 | 2/2011 | Noda et al. | |
| 2014/0325995 A1 | 11/2014 | Zizzo | |
| 2016/0134038 A1 | 5/2016 | Tomikawa et al. | |

FOREIGN PATENT DOCUMENTS

| | | |
|---|---|---|
| JP | H04-36722 U | 3/1992 |
| JP | 2002-329425 A | 11/2002 |
| JP | 2004-259619 A | 9/2004 |
| JP | 2013-175375 A | 9/2013 |

OTHER PUBLICATIONS

Sep. 22, 2016 Office Action Issued in U.S. Appl. No. 14/874,706.

*Primary Examiner* — Jeremy C Norris
(74) *Attorney, Agent, or Firm* — Oliff PLC

(57) ABSTRACT

There is provided a wiring member including: a wiring substrate including wirings including a ground line, and a first insulating layer that covers the wirings and has an opening portion exposing at least a portion of the ground line; a conductive sheet sandwiched between a second insulating layer and a conductive bonding layer and disposed on the first insulating layer in a state where the conductive sheet is folded so that the second insulating layers faces to each other, and in which the conductive bonding layer in a portion which is not folded is electrically connected to the ground line through the opening portion; and a shielding member disposed on the wiring substrate and the conductive sheet to be bonded to the conductive bonding layer in a portion of the conductive sheet which is folded, and is electrically connected to the ground line through the folded portion.

16 Claims, 7 Drawing Sheets

20a Terminal Portion

WIRING MEMBER, METHOD OF MANUFACTURING THE SAME, METHOD OF DESIGNING THE SAME, AND ELECTRONIC APPARATUS

CROSS-REFERENCE TO RELATED APPLICATION(S)

This application is based on and claims priority under 35 U.S.C. 119 from Japanese Patent Application Nos. 2014-226480 filed on Nov. 6, 2014 and 2014-226481 filed on Nov. 6, 2014.

BACKGROUND

1. Technical Field

The present invention relates to a wiring member, a method of manufacturing the same, a method of designing the same, and an electronic apparatus.

2. Background Art

Hitherto, there has been known a wiring member in which, when a shielding member is provided on a wiring substrate including plural wirings, including a signal line and a ground line, and an insulating layer that covers the plural wirings, an opening portion exposing at least a portion of the ground line is provided in the insulating layer, and the shielding member is grounded to the ground line through the opening portion (for example, see JP-A-2004-259619, JP-A-2002-329425 and JP-UM-A-04-36722).

SUMMARY

According to an aspect of the invention, there is provided a wiring member including: a wiring substrate that includes a plurality of wirings including a ground line, and a first insulating layer that covers the plurality of wirings and has an opening portion exposing at least a portion of the ground line; a conductive sheet in which a second insulating layer is provided on one surface side of the conductive sheet and a conductive bonding layer is provided on the other surface side of the conductive sheet, the conductive sheet disposed on the first insulating layer in a state where the conductive sheet is folded so that the second insulating layers faces to each other, and in which the conductive bonding layer in a portion which is not folded is electrically connected to the ground line through the opening portion; and a shielding member that is disposed on the wiring substrate and the conductive sheet so as to be bonded to the conductive bonding layer in a portion of the conductive sheet which is folded, and is electrically connected to the ground line through the folded portion.

BRIEF DESCRIPTION OF THE DRAWINGS

Exemplary embodiments of the present invention will de described in detail based on the following figures, wherein.

DETAILED DESCRIPTION

Figure 1:
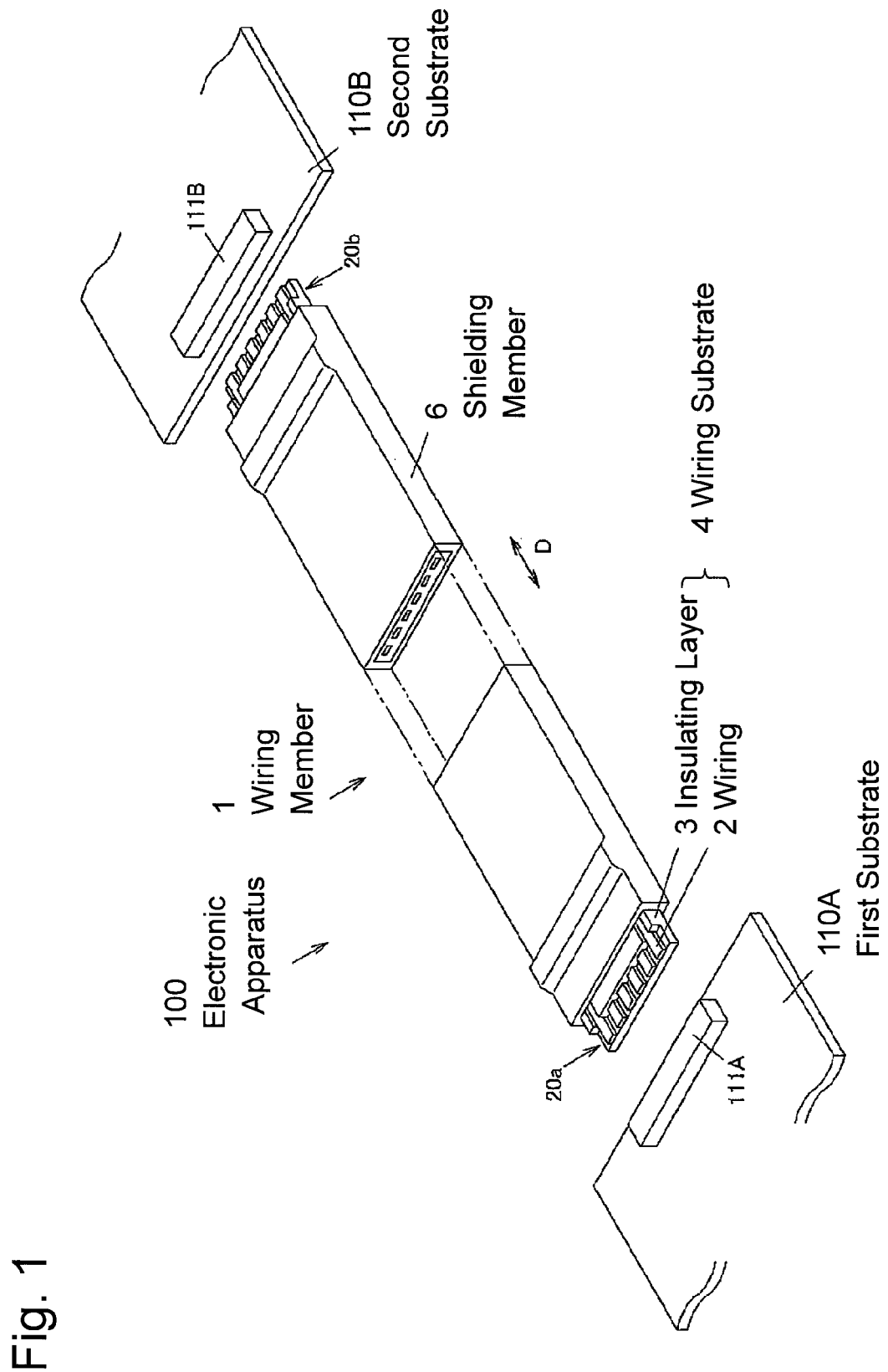
FIG. 1 is a perspective view showing a schematic configuration example of a wiring member according to an embodiment of the present invention and a schematic configuration example of an electronic apparatus to which the wiring member is applied.

Hereinafter, an embodiment of the present invention will be described with reference to the accompanying drawings. Meanwhile, in each drawing, components having substantially the same function are denoted by the same reference numerals and signs, and a repeated description will be omitted. Meanwhile, the scales and shapes of the drawing include portions emphasized in order to facilitate the understanding of features of the present invention, and are not necessarily the same as the scales and shapes of actual members.

Embodiment

FIG. 1 is a perspective view showing a schematic configuration example of a wiring member according to an embodiment of the present invention and a schematic configuration example of an electronic apparatus to which the wiring member is applied.

An electronic apparatus 100 includes a first substrate 110A including a first connector 111A, a second substrate 110B including a second connector 111B, and a wiring member 1 according to the present embodiment which electrically connects the first connector 111A and the second connector 111B. The number of wiring members 1 is not limited to one, and may be two or more.

Examples of the electronic apparatus 100 include a television receiver, an on-vehicle equipment such as a car navigation device or an audio device, an image forming apparatus such as a printer or a multifunction machine, and the like, but are not limited thereto.

For example, an electronic component or a power supply is mounted on the first and second substrates 110A and 110B. The wiring member 1 transmits a signal having a frequency of, for example, 10 MHz to 1 GHz or power. When the electronic apparatus 100 is an image forming apparatus, for example, an image writing signal which is modulated on the basis of image data of cyan (C), magenta (M), yellow (Y), and black (K) colors through four wiring members 1 corresponding to CMYK is transmitted from a controller to an exposure apparatus.

The wiring member 1 includes a wiring substrate 4 in which plural wirings are covered with an insulating layer, a shielding member 6 that covers the wiring substrate 4, and a conductive sheet, to be described later, which electrically connects ground lines among the plural wirings of the wiring substrate 4 and the shielding member 6. In addition, the wiring member 1 is provided with terminal portions 20a and 20b, from which plural wirings 2 are exposed, at both ends thereof in a longitudinal direction D. The terminal portions 20a and 20b at both ends are electrically connected to the first connector 111A provided on the first substrate 110A and the second connector 111B provided on the second substrate 110B, respectively.

The phrase "wiring member" as used herein refers to a member, having flexibility, which has an elongated flat plate shape, includes plural wirings covered with an insulating layer, and has both ends in the longitudinal direction D from which wirings are exposed as terminal portions. The term "ends" as used herein refers to portions of the wiring member 1 in which the terminal portions 20a and 20b are present. The wiring member includes a flexible flat cable (FFC), a flexible printed circuit board (FPC) in which an element is mounted on a substrate, and the like. The phrase "conductive sheet" as used herein refers to a sheet-shaped member having a thickness which is smaller than the width and length thereof and having conductivity. The conductive sheet includes a sheet in which a metal layer is formed on one surface of an insulating layer and a conductive bonding layer is formed on the metal layer, a sheet that does not include an insulating layer or a conductive bonding layer, and a sheet which is constituted by only a metal layer. The phrase "shielding member" as used herein refers to a member that has a function of shielding noise radiated from a wiring to the outside and noise entering a wiring from the outside. The shielding member includes a member in which a metal layer is formed on one surface of an insulating layer and a bonding layer is formed on the metal layer, a member that does not include an insulating layer or a bonding layer, and a member which is constituted by only a metal layer.

Figure 2:
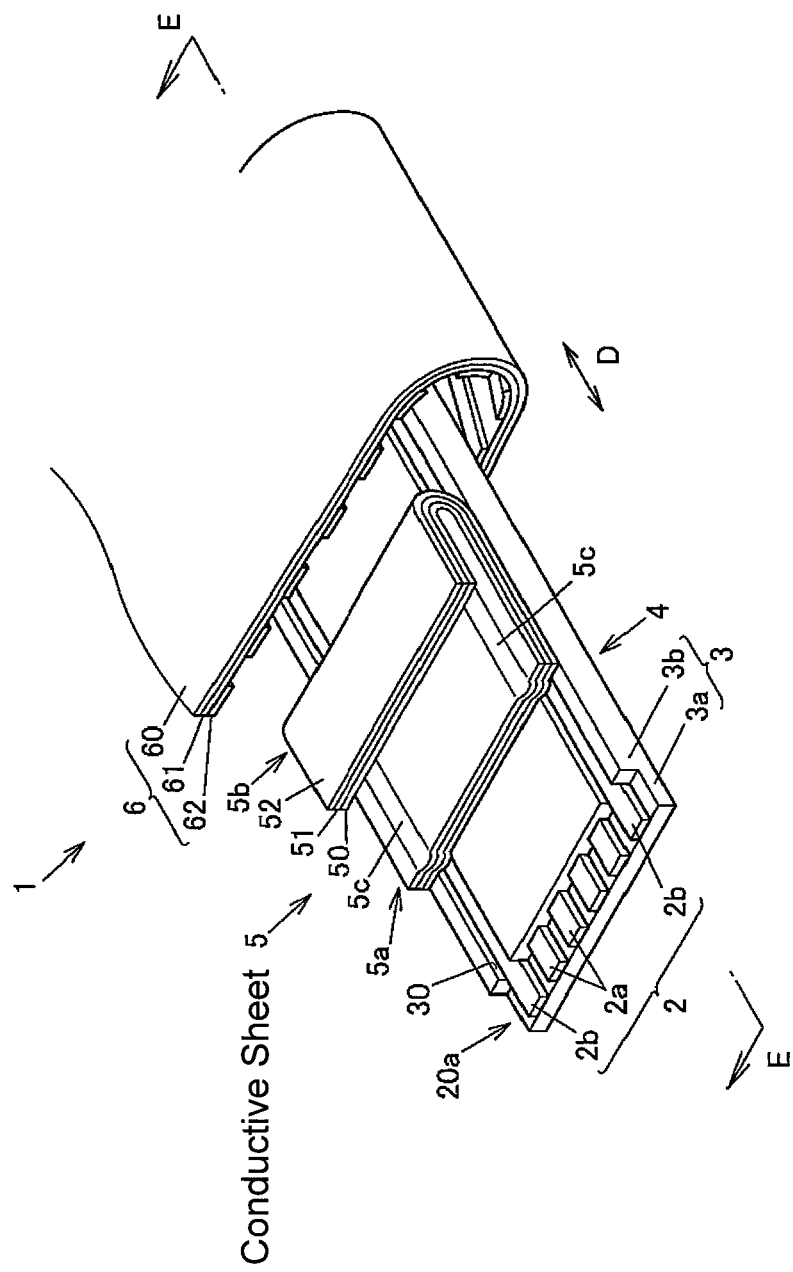
FIG. 2 is an exploded perspective view of the vicinity of one end of the wiring member.
Figure 3:
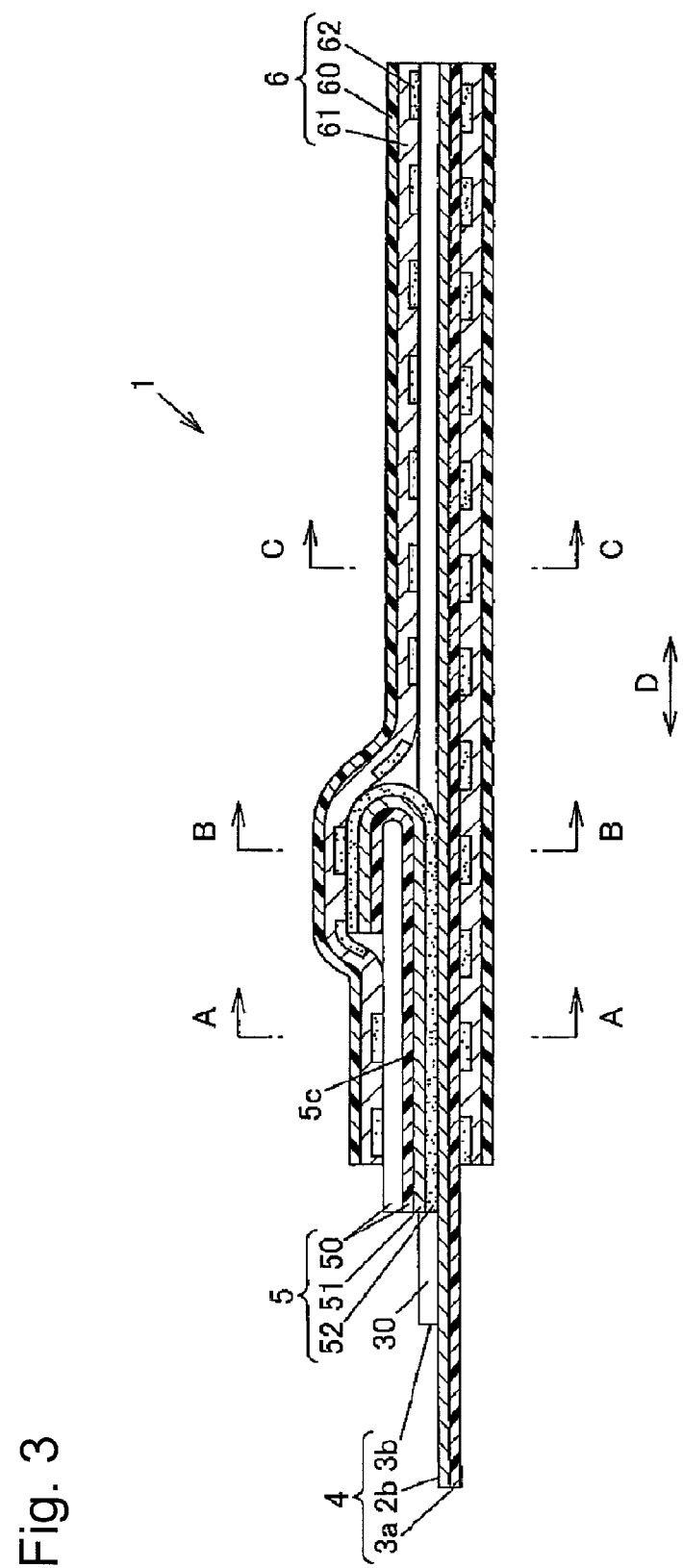
FIG. 3 is a cross-sectional view taken along line E-E shown in FIG. 2.
Figure 4A:
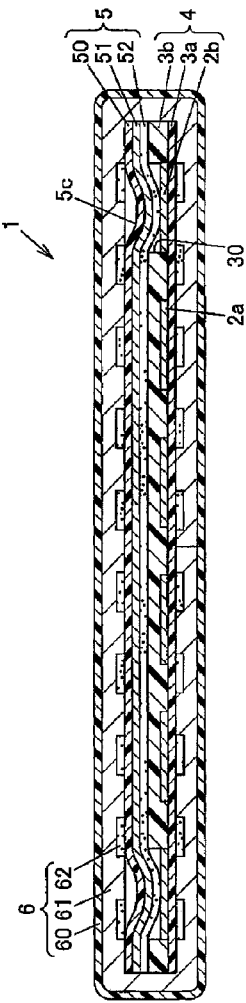
FIGS. 4A to 4C are a cross-sectional view taken along line A-A, a cross-sectional view taken along line B-B, and a cross-sectional view taken along line C-C shown in FIG. 3, respectively.
Figure 4B:
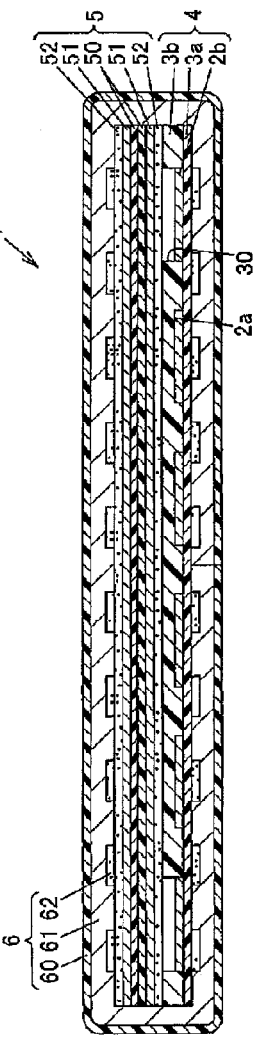
Figure 4C:
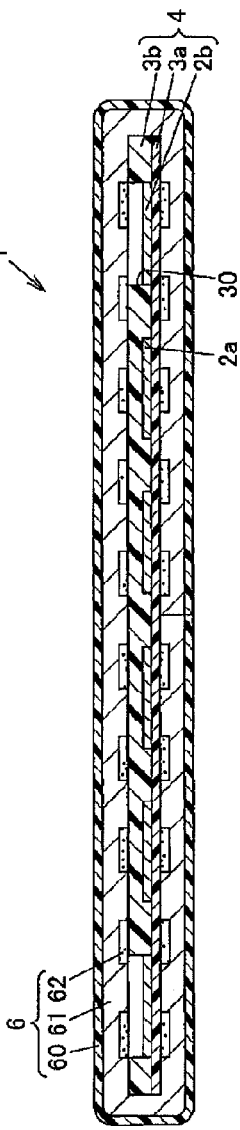

FIG. 2 is an exploded perspective view of the vicinity of one end of the wiring member 1. FIG. 3 is a cross-sectional view taken along line E-E shown in FIG. 2. FIGS. 4A to 4C are a cross-sectional view taken along line A-A, a cross-sectional view taken along line B-B, and a cross-sectional view taken along line C-C shown in FIG. 3, respectively.

As shown in FIG. 2, in the wiring member 1, a conductive sheet 5 is disposed in a region in the vicinity of the end (for example, a region having an interval of equal to or less than a quarter of the total length in the longitudinal direction D with respect to the end). Meanwhile, the region in which the conductive sheet 5 is disposed may be a region other than the region in the vicinity of the end.

Configuration of Wiring Substrate

The wiring substrate 4 includes the plural wirings 2 including ground lines 2b, and an insulating layer 3 that has an opening portion formed therein, covers the plural wirings 2, and exposes at least portions of the ground lines 2b. Specifically, the wiring substrate 4 includes the plural wirings 2 which are arrayed in parallel at fixed intervals, and the insulating layer 3 that covers the plural wirings 2.

The wirings 2 include signal lines 2a and the ground lines 2b. The number of ground lines 2b is two in the drawing, but may be one or three or more. The number of wirings 2 is six in the drawing, but is not limited to six. The wiring 2 is constituted by, for example, a flat plate-shaped conductor having a rectangular cross section, but may have another shape having a rounded rectangular shape or the like. The flat plate-shaped conductor is preferable in achieving electrical connection to the conductive sheet 5. For example, a wiring obtained by applying gold plating to copper can be used as the wiring 2.

The wiring substrate 4 is formed by disposing the plural wirings 2 on one surface of an insulating layer 3a with a bonding layer and performing pressing using a heating roll so that the plural wirings 2 are interposed between a pair of insulating layers 3a and 3b with a bonding layer. The insulating layers 3a and 3b can be formed of, for example, polyester terephthalate (PET). In the insulating layer 3b on the upper side, a groove 30 exposing the ground line 2b is formed along the longitudinal direction D as shown in FIG. 2.

The groove 30 is an example of an opening portion, and may be an elongated hole, a circular hole, or the like. The number of opening portions may be one for one ground line 2b. Alternatively, one opening portion may be formed in the region in the vicinity of the end, or plural opening portions may be formed in the region in the vicinity of the end along the longitudinal direction D. The opening portion may be positioned in a region other than the region in the vicinity of the end.

Configuration of Conductive Sheet

In the conductive sheet 5, an insulating layer 50 is provided on one surface side thereof, and a conductive bonding layer 52 is provided on the other surface side thereof. The insulating layer 50 is disposed on the insulating layer 3 including the grooves 30 of the wiring substrate 4 in a state where the insulating layer 50 is folded so that the insulating layers 50 faces to each other, and the conductive bonding layer 52 is electrically connected to the ground lines 2b through the grooves 30 in a portion which is not folded.

Specifically, the conductive sheet 5 includes the insulating layer 50, a metal layer 51 which is provided on the insulating layer 50, and the conductive bonding layer 52 which is provided on the metal layer 51.

As shown in FIG. 2, the conductive sheet 5 is disposed on the surface of the insulating layer 3b with a bonding layer of the wiring substrate 4 including the grooves 30 in a state where a folded portion 5b is folded so that the insulating layers 50 faces to each other with respect to a base 5a which is positioned on the wiring substrate 4 side. In addition, connector portions 5c at two locations facing the ground lines 2b of the base 5a and the vicinity of the connector portions are pressed by a thermal-compression press machine as shown in FIG. 2, and thus the conductive bonding layer 52 is pushed into the grooves 30 as shown in FIG. 4A, and the conductive bonding layer 52 is thermally compressed on and electrically connected to the ground lines 2b.

Meanwhile, a method of electrically connecting the conductive sheet 5 to the ground lines 2b is not limited to thermal compression, and a method using a heating roller or another method such as ultrasonic bonding may be used. The ultrasonic bonding is a method which is effectively used when the conductive sheet 5 is constituted by only a metal layer or is constituted by a metal layer and a conductive bonding layer. In addition, a protrusion entering the groove 30 may be provided on a press surface of an upper plate of the thermal-compression press machine. Accordingly, the conductive bonding layer 52 of the conductive sheet 5 is easily pushed into the groove 30, and thus electrical connection to the ground line 2b becomes more reliable.

Compared to a configuration in which the shielding member 6 is directly connected to the wiring substrate 4 without using the conductive sheet 5, it is preferable to use the conductive sheet 5 having characteristics in which electric resistance between the shielding member 6 and the ground line 2b is suppressed even when the conductive sheet is bonded under the same conditions. For example, it is preferable that the conductive sheet 5 has a thickness smaller than that of the shielding member 6. In addition, it is preferable that the metal layer 51 of the conductive sheet 5 has ductility higher than that of the metal layer 61 of the shielding member 6 and has a thickness smaller than that of the metal layer 61 of the shielding member 6.

Specifically, the conductive sheet 5 to be used in the present embodiment has a total thickness of approximately 30 μm which is smaller than that of the shielding member 6.

For example, PET having a thickness of approximately 10 μm can be used as the insulating layer 50 of the conductive sheet 5. The metal layer 51 is formed of, for example, silver which has ductility higher than that of the metal layer 61 of the shielding member 6. In addition, the metal layer 51 to be used may have a thickness of, for example, approximately 0.1 μm which is smaller than that of the metal layer 61 of the shielding member 6, and may have a surface resistance of approximately 200 mΩ/□. The conductive bonding layer 52 to be used may be formed by mixing, for example, silver-coated copper powder in a polyester-based thermoplastic resin and may have a thickness of approximately 20 μm. The conductive bonding layer 52 to be used may have a bonding strength of, for example, approximately 4 N/cm (versus PET).

Although the number of conductive sheets 5 and the position thereof in the longitudinal direction D are not particularly limited, it is preferable that the conductive sheet is provided at an end of the ground line 2b in the longitudinal direction D in the wiring substrate 4, and more preferably, at both ends thereof. The shielding member 6 can be grounded at a position close to a ground of the electronic apparatus 100 compared to a case where the conductive sheet is provided in a region other than the region in the vicinity of the end of the wiring substrate 4, for example, in a center portion, and thus a higher shielding effect can be expected.

Configuration of Shielding Member

The shielding member 6 is disposed on the wiring substrate 4 and the conductive sheet 5, is bonded to the conductive bonding layer 52 which is a folded portion of the conductive sheet 5, and is electrically connected to the ground lines 2b through the folded portion.

Specifically, the shielding member 6 includes an insulating layer 60, the metal layer 61 which is provided on one surface of the insulating layer 60, and an insulating bonding layer 62 which is partially provided on the surface of the metal layer 61. The insulating layer 60 to be used may be formed of, for example, PET having a thickness of approximately 10 μm to 20 μm. The metal layer 61 to be used may be formed of, for example, aluminum having a thickness of approximately 10 μm to 20 μm. The insulating bonding layer 62 to be used may be formed of, for example, a thermosetting adhesive having a thickness of approximately 10 μm to 20 μm.

The shielding member 6 is provided so as to cover the vicinity of the wiring substrate 4 and the conductive sheet 5 except for the terminal portions, is bonded to the conductive bonding layer 52 of the folded portion 5b of the conductive sheet 5, and is electrically connected to the ground lines 2b through the folded portion 5b and the base 5a.

Figure 5:
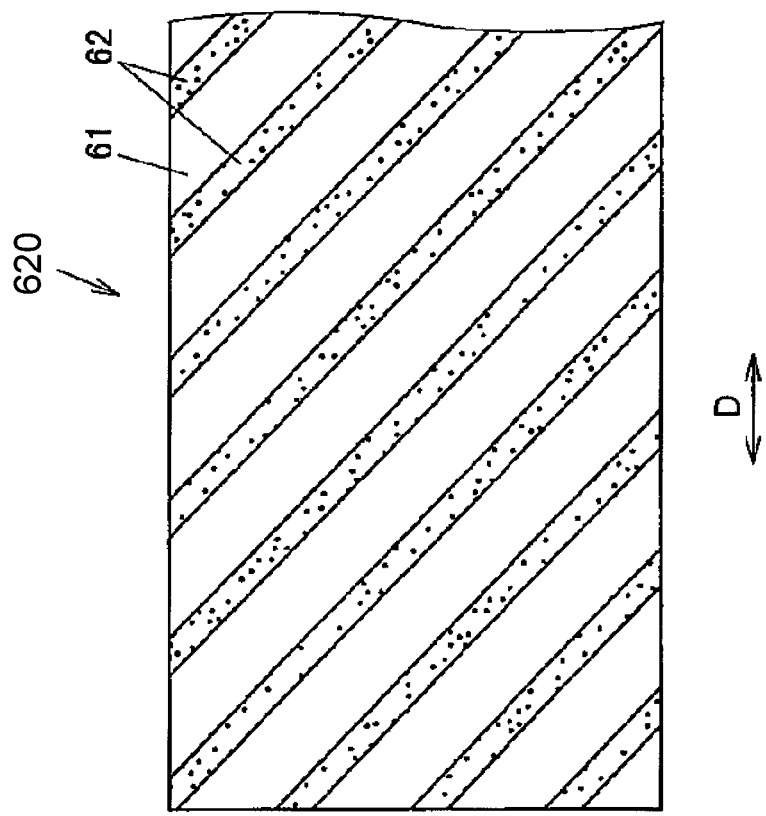
FIG. 5 is a plan view showing a main portion of a shielding member.

FIG. 5 is a plan view showing a main portion of the shielding member 6. The insulating bonding layer 62 of the shielding member 6 is constituted by plural line patterns 620 which extend in a direction intersecting the longitudinal direction D so as to be parallel to each other. That is, the insulating bonding layer 62 is constituted by repetitive patterns in which the line patterns 620 are repeated in a width direction perpendicular to the longitudinal direction D. The patterns may be patterns other than the patterns shown in FIG. 5 because electrical conduction may be preferably allowed at the time of bonding the shielding member 6 to the folded portion 5b of the conductive sheet 5. For example, the patterns may be plural line patterns which extend in the longitudinal direction D so as to be parallel to each other, dot patterns constituted by dots having a size that does not cover the entire folded portion 5b, or other repetitive patterns. Further, the patterns may not be repetitive patterns insofar as electrical conduction is allowed.

The plural line patterns 620 extending in a direction intersecting the longitudinal direction D are used as the insulating bonding layer 62, and thus a region of the metal layer 61 which is not provided with the line patterns 620 comes into contact with the conductive bonding layer 52 of the conductive sheet 5, thereby allowing the metal layer 61 of the shielding member 6 to be electrically connected to the ground lines 2b. In addition, the accurate positioning of the folded portion 5b at the time of bonding the shielding member 6 becomes unnecessary. In addition, shielding characteristics are stabilized by bringing the shielding member 6 into close contact with the wiring substrate 4 by the insulating bonding layer 62.

Method of Designing Wiring Member

Next, an example of a method of designing a wiring member will be described.

(1) Measurement of Noise Characteristics

First, noise characteristics in a case where the size of the conductive sheet 5 is changed are measured. This is because, when a conductive member is provided at an end of a wiring member, as will be described later, a suppression effect can be particularly expected at a frequency corresponding to the size of the conductive member. The size of the conductive sheet 5 is, for example, the length of a diagonal line of the base 5a. The noise characteristics may be noise characteristics in a single wiring member 1, or may be noise characteristics in a state where the wiring member is embedded in an electronic apparatus. Meanwhile, the size of the conductive sheet 5 may be the length of the base 5a in the longitudinal direction D or an area of the base 5a.

(2) Selection of Size of Conductive Sheet

Next, the size of the conductive sheet 5 which satisfies a noise standard value required for an electronic apparatus having the wiring member 1 mounted thereon is selected from measurement results. The size of the conductive sheet 5 is arbitrary insofar as a noise standard value can be satisfied only by optimizing the shielding member 6. However, when noise which has a specific frequency and is not likely to be suppressed only by optimizing the shielding member 6 is present, a noise standard value is easily satisfied by using the conductive sheet 5 having a size corresponding to the frequency.

Method of Manufacturing Wiring Member

Next, an example of a method of manufacturing the wiring member 1 will be described.

(1) Formation of Wiring Substrate

First, a cutout window is opened in a region corresponding to the end of the insulating layer 3b with a bonding layer by punching or the like, and the insulating layer with a bonding layer 3a having the plural wirings 2 formed thereon and the insulating layer 3b with a bonding layer covering the plural wirings 2 are bonded to each other by a heating roller. Next, a portion of the insulating layer 3b which covers the ground line 2b is peeled along the longitudinal direction D. In this manner, the wiring substrate 4 is formed.

(2) Arrangement of Conductive Sheet

Next, the conductive sheet 5 having a size selected in the method of designing a wiring member is prepared.

Next, the prepared conductive sheet 5 is disposed in a region in the vicinity of each of the terminal portions 20a and 20b. Next, the conductive sheet 5 is bonded to the surface of the insulating layer 3b by performing thermal compression on a region including a connector portion 5c under conditions of a temperature of 120° C., a pressure of 0.5 MPa to 1 MPa, and a time of 5 seconds to 10 seconds, and the conductive bonding layer 52 is brought into contact with the ground line 2b so as to be electrically connected thereto. Next, a portion of the conductive sheet 5 on the side opposite to the terminal portions 20a and 20b sides is folded to form the folded portion 5b. Meanwhile, when the folded portion 5b has a size that does not cover the entire connector portion 5c, the connector portion 5c which is not covered may be subjected to thermal compression after the folded portion 5b is formed. In addition, the folded portion 5b may be fixed so as not to return to its original state by applying a bonding member such as a double-sided tape on the insulating layer 50 side of the folded portion 5b in order to maintain the folded state.

(3) Covering with Shielding Member

The entirety except for the terminal portions 20a and 20b of the wiring substrate 4 having the conductive sheet 5 disposed thereon is covered with the shielding member 6, and the shielding member 6 is bonded to the conductive sheet 5 and the wiring substrate 4 by a heating roller. In this manner, the wiring member 1 is formed.

When the plural wiring members 1 are manufactured, the sizes of the conductive sheets 5 may be made different from each other in accordance with the noise characteristics required for an electronic apparatus on which the wiring members are mounted.

Operations and Effects of the Present Embodiment (1) Reduction in Connection Impedance Between Conductive Sheet and Ground Line It is considered that a configuration is adopted in which, when a shielding member in which a conductive bonding layer is formed on one surface of a metal layer without using a conductive sheet is used, the shielding member is directly bonded to a ground line without using the conductive sheet by using a conductive bonding layer. In this case, it is necessary to make the metal layer thin in order to follow the formation of an opening portion, but there is a concern of a deterioration in shielding characteristics being caused. On the other hand, when the metal layer of the shielding member is made thick in order to obtain desired shielding characteristics, it is difficult to follow a concavo-convex shape of the opening portion, and thus there is a concern that ground impedance is increased. Accordingly, it may be difficult to adopt such a configuration.

Consequently, it is considered that a configuration is adopted in which a relatively thick metal layer is used as a metal layer of a shielding member, a double-sided conductive tape (tape that includes a conductive bonding layer provided on the front and back sides thereof and has conductivity between the front and back sides) which has a characteristic of having a tendency to follow the shape of an opening portion rather than the shape of the shielding member to be used is interposed between the shielding member and the opening portion, and the shielding member is electrically connected to a ground line through the double-sided conductive tape. In this case, it may be difficult to obtain the double-sided conductive tape having desired performance, or it may not be possible to obtain the double-sided conductive tape at desired cost. Accordingly, it may also be difficult to adopt such a configuration.

Consequently, as in the present embodiment, the shielding member 6 is grounded to the ground line 2b of the wiring substrate 4 using the conductive sheet 5 including the insulating layer 50 on one surface side and the conductive bonding layer 52 on the other surface side, and thus the restriction on the shielding member 6 is reduced compared to a configuration in which the shielding member 6 and the ground line 2b are electrically connected to each other without using the conductive sheet 5. That is, it is possible to exhibit excellent shielding characteristics by using the shielding member 6 having a large thickness. On the other hand, the metal layer 51 of the conductive sheet 5 has a thickness smaller than that of the metal layer 61 of the shielding member 6, and thus it is possible to reduce ground impedance between the conductive sheet 5 and the ground line 2b.

In addition, when a sheet-like member is thermally compressed on a wiring member such as an FFC, a heating roller is generally used (for example, see paragraph [0038] of JP-A-2002-329425 and FIG. 5D of JP-UM-A-04-36722). For this reason, also in a structure of the present embodiment in which a conductive sheet is interposed between a wiring substrate and a shielding member, a method of performing thermal compression using a heating roller in a state where the conductive sheet is disposed on the wiring substrate or in a state where the shielding member is disposed on the conductive sheet is considered.

However, in the case of the heating roller, since pressure is applied while relatively moving the wiring member and the heating roller, the conductive sheet is not likely to sufficiently follow the concavo-convex shape of the opening portion due to a cause such as a change in pressure applied to the conductive sheet in association with the relative movement, and it is difficult to obtain a desired bonding state (connection impedance), and thus a higher shielding effect is not obtained.

Consequently, in the present embodiment, when the conductive sheet 5 is thermally bonded, a connection impedance between the conductive sheet 5 and the ground line 2b is easily reduced compared to a case where the thermal compression of a conductive sheet is performed using a heating roller by using a press machine capable of applying pressure in a stopped state, or the like.

(2) Suppression of Deterioration in Noise Characteristics

In a wiring member mounted on an electronic apparatus, noise having frequencies corresponding to harmonic components of a signal waveform to be transferred tends to be generated. Consequently, a shielding structure that is expected to be capable of exhibiting a noise reduction effect in such specific frequencies is desired. As such a structure, a structure is adopted in which a shielding member and a conductive tape are wound around an end of a wiring substrate, and a conductive holding member holding the wiring substrate is provided at the position of the conductive tape, and the holding member is fixed to a sheet metal box, for example, as in a configuration disclosed in JP-A-2013-175375, and a method of setting the length of the shielding member to be a length corresponding to a specific frequency desired to be suppressed is considered.

However, when the length of the shielding member itself is set to be a length corresponding to a specific frequency desired to be suppressed, an optimized noise suppression effect can be expected with respect to a specific frequency component. However, as a result of a change in the length of the shielding member itself, there is a concern that noise characteristics deteriorate at frequencies other than the specific frequency.

Consequently, in the present embodiment, it is possible not only to expect a noise reduction effect at a specific frequency by changing the size of the conductive sheet 5 rather than the size of the shielding member 6, but also to suppress a deterioration in noise characteristics at frequencies other than the specific frequency compared to a case where the length of the shielding member 6 itself is changed.

In addition, regarding the wiring member 1 that is expected to be mounted on an electronic apparatus, when the plural wiring members 1 having different sizes of the conductive sheets 5 are provided from others, designing the wiring member 1 becomes easier than in a case where the plural wiring members 1 having different sizes of the conductive sheets 5 are prepared by oneself.

Modified Example of Shielding Member

Regarding the shielding member 6, the shielding member 6 that does not include a bonding layer may be used insofar as the shielding member can be disposed in proximity to the wiring substrate 4 without using an adhesive by covering the vicinity of the wiring substrate 4, or the like. In addition, the shielding member 6 may be provided only on a side where the conductive sheet 5 is provided. In addition, it is preferable that the shielding member 6 covers the entire wiring substrate 4 except for the vicinity of the terminal portions 20a and 20b of the wiring substrate 4, but a configuration in which the shielding member covers the vicinity of only a portion of the wiring substrate 4 may also be adopted. For example, the shielding member may be provided only in a region in the vicinity of an end, or may be provided in a region other than the region in the vicinity of the end. In addition, a conductive bonding layer may be entirely or partially formed on the surface of the metal layer 61 as a bonding layer.

Modified Example of Conductive Sheet

Figure 6C:
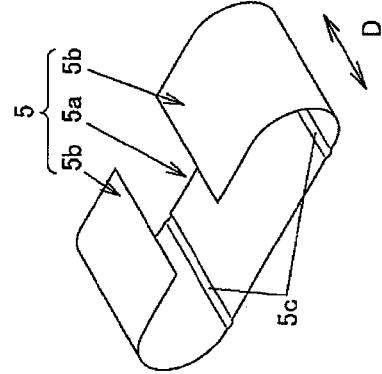
FIGS. 6A to 6D are perspective views showing modified examples of a conductive sheet.
Figure 6D:
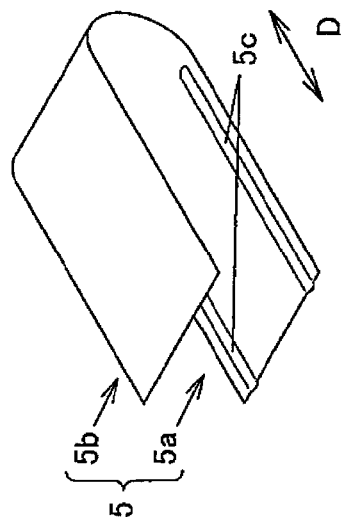
Figure 6A:
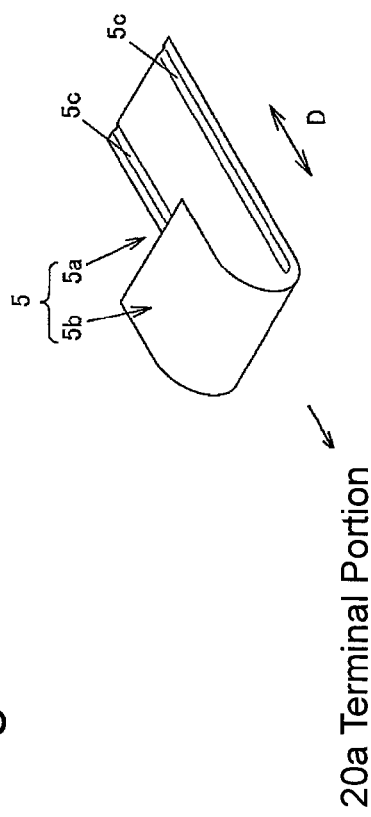
Figure 6B:
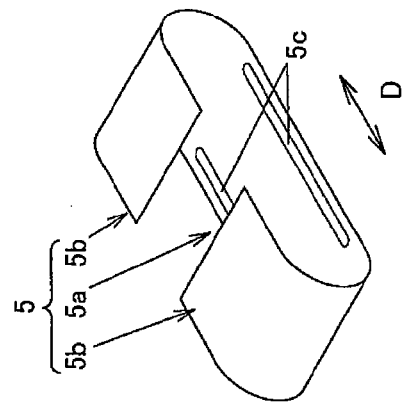

FIGS. 6A to 6D are perspective views showing modified examples of the conductive sheet 5. As shown in FIG. 6A, in the conductive sheet 5, the folded portion 5b may be disposed on the terminal portion 20a side. This is the same as in the other terminal portion 20b. In addition, as shown in FIG. 6B, in the conductive sheet 5, the folded portion 5b may be provided on both end sides in the longitudinal direction D. In addition, as shown in FIG. 6C, the conductive sheet 5 may be disposed so as to have an orientation in a direction perpendicular to the longitudinal direction D, and the folded portion 5b may be provided on both end sides thereof. In addition, as shown in FIG. 6D, in the conductive sheet 5, the folded portion 5b may be formed to have the same size as that of the base 5a.

When the entire conductive sheet 5 is covered with the shielding member 6, noise can be suppressed compared to a case where only a portion of the conductive sheet is covered, and thus it is preferable that the entire conductive sheet is covered with the shielding member 6. Meanwhile, a portion in which the conductive sheet 5 and the shielding member 6 overlap each other has a double shielding function, and thus the entire conductive sheet 5 may not be covered with the shielding member 6.

Any portion of the side of the conductive sheet 5 may be folded. However, it is preferable that the folding is performed from one side of each of the terminal portions 20a and 20b toward the other side of each of the terminal portions 20b and 20a because grounding to each ground line is reliably performed even when plural ground lines are present.

The amount of folding of the conductive sheet 5 is also arbitrary. However, it is preferable that the base 5a on the side which is made to follow the opening portion is formed to be wider than the folded portion 5b because a contact area between the shielding member 6 and the ground line 2b is increased, which facilitates a reduction in impedance between the shielding member 6 and the ground line 2b.

EXAMPLES

A sample corresponding to the present embodiment was created as a sample in an example. That is, the wiring substrate 4 to be used was configured such that copper having a gold-plated surface was interposed between the insulating layers 3a and 3b with a bonding layer which are formed of PET. The insulating layer 50 to be used of the conductive sheet 5 was constituted by a PET sheet, the conductive bonding layer 52 formed by mixing a silver-coated copper powder in a polyester-based thermoplastic resin was used, and the metal layer 51 formed of silver and having a thickness of approximately 0.1 μm was used. In the shielding member 6, the insulating layer 60 constituted by a PET sheet and having a thickness of 15 μm was used, the metal layer 61 formed of aluminum and having a thickness of 15 μm was used, and the insulating bonding layer 62 having a thickness of 15 μm was used.

Figure 7:
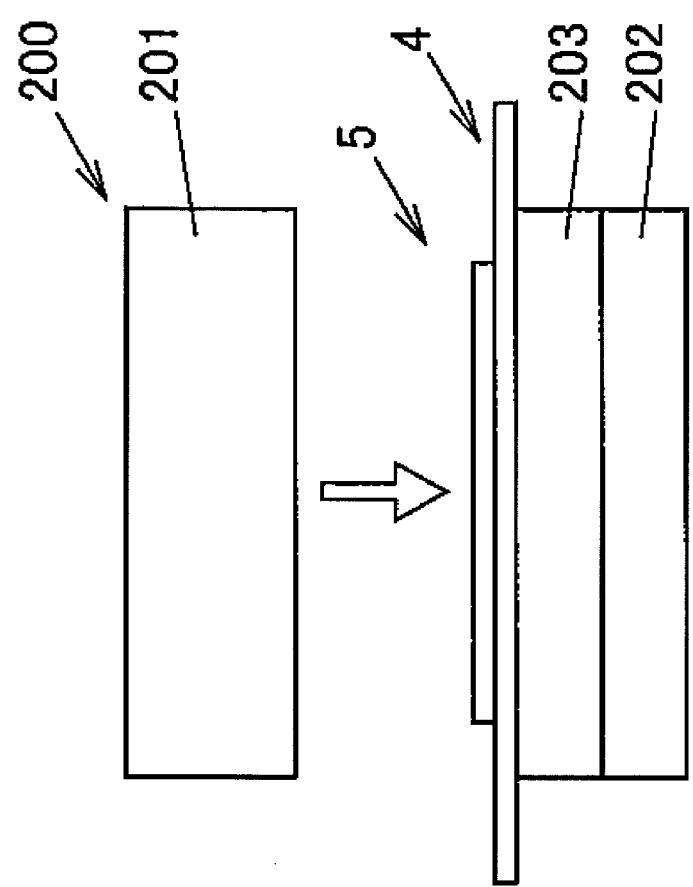
FIG. 7 is a diagram showing a process of thermally compressing a conductive sheet on a wiring substrate using a thermal-compression press machine.

The conductive sheet 5 was bonded to the wiring substrate 4 by a thermal-compression press machine shown in FIG. 7, and the shielding member 6 was attached using a heating roller. A thermal-compression press machine 200 includes an upper plate 201, a lower plate 202, and an elastic member 203 which is disposed on the lower plate 202. It is preferable that the elastic member 203 is constituted by, for example, sponge having a hardness of approximately 30.

Environmental Test

The wiring substrate 4 was disposed on the elastic member 203, the conductive sheet 5 was disposed on the wiring substrate 4, and the upper plate 201 was pressed downward at a pressure (for example, 0.35M pa) which was determined in advance for a period of time (for example, 2 seconds) which was determined in advance while heating the upper plate 201 to 98° C. or 110° C. and heating the lower plate 202 to a temperature (for example, 100° C. to 110° C.) which was determined in advance. In this manner, five samples were created, and a resistance value between a ground line and a shielding member of each of the samples before and after an environmental test (temperature of 55° C. and humidity of 95% RH) was measured. The results thereof are shown in Table 1.

TABLE 1

| | Temperature of press surface of upper plate | |
|---|---|---|
| | 98° C. | 110° C. |
| Resistance value before environmental test (Ω) | 2 to 3 | 2 to 3 |
| Resistance value after environmental test (Ω) | 5 to 8 | 5 to 8 |

The resistance value between the ground line and the shielding member after the environmental test was increased by approximately 3Ω to 5Ω with respect to the resistance value before the environmental test, and satisfied a target value.

Standard Deviation Between Resistance Value and Average Value

The wiring substrate 4 was disposed on the elastic member 203, the conductive sheet 5 was disposed on the wiring substrate 4, and the upper plate 201 was pressed downward at a pressure (for example, 0.35 Mpa) which was determined in advance for a period of time (for example, 2 seconds) which was determined in advance while heating the upper plate 201 and the lower plate 202 to a temperature (for example, 100° C. to 110° C.) which was determined in advance.

In this manner, five samples were created, and a resistance value between a ground line and a shielding member of each of the samples was measured. The results thereof are shown in Table 2.

TABLE 2

| Sample No. | Resistance value (Ω) |
|---|---|
| 1 | 1.3 |
| 2 | 7.6 |
| 3 | 4.5 |
| 4 | 3.8 |
| 5 | 8.7 |
| Average value | 5.18 |
| Standard deviation | 2.99 |

Comparative Example

In a comparative example, a conductive tape was not used, and a shielding member with a bonding layer was directly connected to the ground line 2b of the wiring substrate 4 using a heating roller.

Eight samples were created, and a resistance value between a ground line and a shielding member of each of the samples was measured. The results thereof are shown in Table 3.

TABLE 3

| Sample No. | Resistance value (Ω) |
|---|---|
| 1 | 48 |
| 2 | 6.6 |
| 3 | 120 |
| 4 | 5.6 |
| 5 | 4.2 |
| 6 | 45 |
| 7 | 38.5 |
| 8 | 21.5 |
| Average value | 36.18 |
| Standard deviation | 38.35 |

Measurement Results of Noise

Each of the samples of the comparative example and each of the samples of the present example was mounted on a printer, and noise measurement was performed in a state where the printer was operating. The results thereof are shown in Table 4. Table 4 shows measurement results for a VCCI standard value, and shows a margin for a noise standard value of VCCI at a frequency (approximately 220 Mhz) having the lowest margin (degree of margin) in a measurement frequency band. Meanwhile, the standard value represents a margin for a QP value (quasi-peak), and 220 Mhz is a frequency equivalent to a fourth-order harmonic of a fundamental frequency transmitted to an FFC.

TABLE 4

| Sample | Margin for noise standard value |
|---|---|
| The present example | 7.5 dB |
| Comparative example | 2.8 dB |

Evaluation Results

Regarding a resistance, in the present example, both an average value and a standard deviation (variations) of the resistance value are drastically improved compared to those in the comparative example. Regarding noise, in the comparative example, there is only a margin of 2.8 dB for the standard value, but a margin of 7.5 dB can be secured in the present example.

Meanwhile, an embodiment of the present invention is not limited to the above-described embodiment, and can be modified and implemented in various ways without departing from the scope of the present invention.

In addition, some of components in the embodiment may be omitted without departing from the scope of the present invention. In the flow of the embodiment, steps may be added, deleted, changed, or switched.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and there equivalents.

What is claimed is:

1. A wiring member comprising:
a wiring substrate that includes a plurality of wirings including a ground line, and a first insulating layer that covers the plurality of wirings and has an opening portion exposing at least a portion of the ground line;
a conductive sheet in which a second insulating layer is provided on one surface side of the conductive sheet and a conductive bonding layer is provided on the other surface side of the conductive sheet, the conductive sheet disposed on the first insulating layer in a state where the conductive sheet is folded so that the second insulating layers faces to each other, and in which the conductive bonding layer in a portion which is not folded is electrically connected to the ground line through the opening portion; and
a shielding member that is disposed on the wiring substrate and the conductive sheet so as to be bonded to the conductive bonding layer in a portion of the conductive sheet which is folded, and is electrically connected to the ground line through the folded portion.

2. The wiring member according to claim 1,
wherein the shielding member includes a metal layer and an insulating bonding layer provided on one surface of the metal layer, and
at least a portion of the shielding member which is bonded to the conductive bonding layer in the folded portion of the conductive sheet does not include the insulating bonding layer.

3. The wiring member according to claim 2,
wherein the insulating bonding layer of the shielding member is constituted by a plurality line patterns that extend in a longitudinal direction of the wiring substrate or a direction perpendicular to the longitudinal direction, and
the plurality of line patterns are parallel to each other.

4. The wiring member according to claim 1,
wherein the conductive sheet has a smaller thickness than the shielding member.

5. The wiring member according to claim 1,
wherein each of the conductive sheet and the shielding member includes a metal layer, and
the metal layer of the conductive sheet has a higher stretching property than the metal layer of the shielding member.

6. The wiring member according to claim 1,
wherein the conductive sheet includes a metal layer between the second insulating layer and the conductive bonding layer,
the shielding member includes a metal layer and a bonding layer provided on the metal layer, and
the metal layer of the conductive sheet has a smaller thickness than the metal layer of the shielding member.

7. An electronic apparatus comprising:
the wiring member according to claim 1; and
first and second substrates that are connected to each other by the wiring member.

8. A wiring member comprising:
a wiring substrate in which a plurality of wirings including a ground line are covered with an insulating layer and at least a portion of the ground line is exposed from the insulating layer;
a conductive sheet that includes a folded portion which is folded and a non-folded portion which is not folded, the non-folded portion being electrically connected to the ground line exposed from the insulating layer; and
a shielding member that is disposed on the wiring substrate and the conductive sheet and is electrically connected to the ground line through the folded portion of the conductive sheet.

9. A method of manufacturing a wiring member, the method comprising:
preparing a wiring substrate that includes a plurality of wirings including a ground line, and a first insulating layer that covers the plural wirings and has an opening portion exposing at least a portion of the ground line;
disposing a conductive sheet, having a second insulating layer provided on one surface side of the conductive sheet and a conductive bonding layer provided on the other surface side of the conductive sheet, on the first insulating layer;
thermally compressing the conductive bonding layer of the conductive sheet on the ground line by moving a pressing member in a thickness direction of the wiring substrate;
folding a portion of the conductive sheet which is separated from a location thermally compressed on the ground line or a location which is to be thermally compressed on the ground line, after or before performing the thermally compressing the conductive bonding layer; and
electrically connecting a shielding member to the folded portion of the conductive sheet.

10. The method according to claim 9,
wherein in the thermally compressing the conductive bonding layer, the wiring substrate is supported through an elastic member.

11. The method according to claim 9,
wherein the electrically connecting the shielding member is performed by thermally compressing the shielding member on the conductive bonding layer of the conductive sheet using a heating roller.

12. A method of manufacturing a plurality of wiring members each of which includes: a wiring substrate that includes a plurality of wirings including a ground line, and a first insulating layer that covers the plural wirings and has an opening portion exposing at least a portion of the ground line; a conductive sheet in which a second insulating layer is provided on one surface side of the conductive sheet and a conductive bonding layer is provided on the other surface side conductive sheet, which is disposed on the first insulating layer in a state where the conductive sheet is folded so that the second insulating layers faces to each other, and in which the conductive bonding layer in a portion thereof which is not folded is electrically connected to the ground line through the opening portion; and a shielding member that is disposed on the wiring substrate and the conductive sheet so as to be bonded to the conductive bonding layer in a portion of the conductive sheet which is folded, and is electrically connected to the ground line through the folded portion,
the method comprising:
manufacturing the plurality of wiring members so that lengths of the wiring substrates in a longitudinal direction in the portions of the conductive sheets which are not folded are different from each other among the plurality of wiring members.

13. The method according to claim 12,
wherein the conductive sheets are formed so that width directions of the conductive sheets perpendicular to a longitudinal direction of the wiring substrate are equal to each other among the plurality of wiring members.

14. The method according to claim 12,
wherein the wiring substrates are formed so that width directions of the wiring substrates perpendicular to a longitudinal direction of the wiring substrate are equal to each other among the plural wiring members.

15. A method of designing a wiring member including: a wiring substrate that includes a plurality of wirings including a ground line, and a first insulating layer that covers the plurality of wirings and has an opening portion exposing at least a portion of the ground line; a conductive sheet in which a second insulating layer is provided on one surface side of the conductive sheet and a conductive bonding layer is provided on the other surface side of the conductive sheet, which is disposed on the first insulating layer in a state where the conductive sheet is folded so that the second insulating layers faces to each other, and in which the conductive bonding layer in a portion of the conductive sheet which is not folded is electrically connected to the ground line through the opening portion; and a shielding member that is disposed on the wiring substrate and the conductive sheet so as to be bonded to the conductive bonding layer in a portion of the conductive sheet which is folded, and is electrically connected to the ground line through the folded portion,
the method comprising:
measuring noise characteristics in a case where a size of the conductive sheet is changed; and
selecting a size of the conductive sheet which satisfies a standard value required for an electric apparatus on which the wiring member is mounted, on a basis of the measuring noise characteristics.

16. A method of manufacturing a wiring member which is used to manufacture the wiring member using the conductive sheet having a size designed in the method of designing a wiring member according to claim 15.

* * * * *